United States Patent [19]
Satoh et al.

[11] Patent Number: 5,674,756
[45] Date of Patent: Oct. 7, 1997

[54] METHOD FOR INTRINSIC-GETTERING SILICON WAFER

[75] Inventors: Yuhki Satoh, Aichi; Hisashi Furuya, Saitama, both of Japan

[73] Assignees: Mitsubishi Materialc Corporation; Mitsubishi Materials Silicon Corporation, both of Tokyo, Japan

[21] Appl. No.: 502,053

[22] Filed: Jul. 14, 1995

[30] Foreign Application Priority Data

Jul. 29, 1994 [JP] Japan ............... 6-177940

[51] Int. Cl.$^6$ ............... H01L 21/322
[52] U.S. Cl. ............... 437/10
[58] Field of Search ............... 437/10, 12, 247, 437/248; 148/DIG. 60; 117/2

[56] References Cited

U.S. PATENT DOCUMENTS

| | | | |
|---|---|---|---|
| 4,432,809 | 2/1984 | Chye et al. | 437/10 |
| 4,437,922 | 3/1984 | Bischoff et al. | 156/DIG. 73 |
| 4,548,654 | 10/1985 | Tobin | 437/10 |
| 4,622,082 | 11/1986 | Dyson et al. | 437/10 |
| 4,661,166 | 4/1987 | Hirao | 437/10 |
| 4,851,358 | 7/1989 | Huber | 437/10 |
| 4,954,189 | 9/1990 | Hahn et al. | 437/12 |
| 4,994,399 | 2/1991 | Aoki | 437/11 |
| 5,110,404 | 5/1992 | Fusegawa et al. | 437/10 |
| 5,327,007 | 7/1994 | Imura et al. | 257/610 |
| 5,403,406 | 4/1995 | Falster et al. | 437/10 |

FOREIGN PATENT DOCUMENTS

| | | | |
|---|---|---|---|
| 5-275431 | 10/1993 | Japan | 437/10 |
| WO93/20582 | 10/1993 | WIPO . | |

*Primary Examiner*—John Niebling
*Assistant Examiner*—S. Mulpuri
*Attorney, Agent, or Firm*—McAulay Fisher Nissen Goldberg & Kiel. LLP

[57] ABSTRACT

To provide a silicon-wafer intrinsic-gettering method making it possible to obtain a desired intrinsic-gettering effect through a heat treatment of 1,000° C. or lower and optionally change the thickness of a DZ layer. To obtain a silicon wafer with large intrinsic-gettering effectiveness, a silicon wafer containing oxygen precipitate nuclei is quickly heated from room temperature up to 800° to 1,000° C. and holding the state for 0.5 to 20 min is used. In addition to the above heat treatment step, it is preferable to further use the step of naturally cooling the silicon wafer up to room temperature and the step of heating the naturally-cooled silicon wafer from 500° to 700° C. up to 800° to 1,100° C. at a rate of 2° to 10° C./min and holding the silicon wafer at the temperature for 2 to 48 hr.

7 Claims, 4 Drawing Sheets

METHOD FOR INTRINSIC-GETTERING SILICON WAFER

BACKGROUND OF THE INVENTION

1. Field of the Invention

The present invention relates to an intrinsic-gettering method by heat treatment of a silicon wafer in order to obtain a silicon wafer suited to fabricate an LSI such as a DRAM.

2. Description of the Prior Art

In recent years, it has been requested to improve the integration level of a semiconductor device such as a DRAM because mass production of a megabit memory has been realized, which also requests a further improvement of the quality of a silicon wafer.

One of the methods to meet these requests is an intrinsic gettering method. This method prevents a contamination of the surface layer of a silicon wager where a device is fabricated. This is usually done by previously producing defects in the silicon wafer or adding impurities to the wafer, which will act as an absorbing source for contamination induced in the subsequent processes.

As shown in FIG. 4, the above conventional gettering is performed by annealing of a silicon wafer at 1,150° C. for approx. 4 hr and thereafter heating it at 700° C. for approx. 16 hr and moreover heating it at 950° C. for approx. 4 hr. These three step heat treatments are all performed in nitrogen gas to precipitate extra oxygen in the wafer. The oxygen at a depth of several microns from the wafer surface is diffused to the wafer surface and Is extinguished in the first-step heat treatment. Next, nuclei of oxygen precipitates are formed in the wafer by the second-step heat treatment. Finally, the nuclei grow into larger precipitates by the third-step heat treatment. Thereby, a layer (denuded zone; hereinafter referred to as a DZ layer) on which precipitates are not formed is need to be introduced near the wafer surface. Oxygen precipitates in the bulk (intrinsic gettering source) getter and fix metallic contamination or impurities which are produced in subsequent processes and affect device operations, which prevents contamination of the wafer surface where a device is fabricated.

However, the above existing intrinsic-gettering method requires a heat treatment at higher temperature than 1,000° C. because a DZ layer that extends from wafer surface to a depth of several microns is formed by out-diffusing the oxygen. Thereby, there is a problem that a warpage occurs on a silicon wafer, the wafer is easily contaminated, or a dislocation called a slip line occurs in the wafer during the heat treatment at the high temperature. Moreover, the temperature of a device process has been lowered because the integration level of a device has been improved in recent years and thereby it is strongly requested to lower the temperature of the intrinsic gettering process.

SUMMARY OF THE INVENTION

An object of the present invention is to provide an intrinsic-gettering method for a silicon wafer showing a desired intrinsic-gettering effect through a heat treatment of 1,000° C. or lower.

Another object of the present invention is to provide an intrinsic-gettering method making it possible to optionally change the thickness of a DZ layer.

As shown in FIG. 1, the intrinsic-gettering method of the present invention is an improvement of a wafer heat treatment method for intrinsic-gettering and it is characterized by including the step of quick temperature raise of a silicon wafer containing oxygen precipitate nuclei, from room temperature up to 800° to 1,000° C. and holding the state for 0.5 to 20 min.

The present invention is described below in detail.

In a silicon wafer immediately after being cut from a silicon crystal ingot grown by the Czochralski method (hereinafter referred to as the CZ method), ground, and polished, some oxygen atoms contained in the crystal gather to form an oxygen precipitate nucleus. However, it is preferable to use a silicon wafer obtained by holding the above silicon wafer at a relatively low temperature of 500° to 800° C. for 0.5 to 20 hr because oxygen precipitate nuclei are introduced into the wafer at a relatively high density.

As a quick heating method, it is possible to use a method of quickly putting a silicon wafer containing oxygen precipitate nuclei at room temperature into a furnace heated up to 800° to 1,000° C., However, It is also possible to use a method of setting a silicon wafer containing oxygen precipitate nuclei at room temperature in a furnace with a lamp capable of producing a high temperature and turning on the lamp switch to start heat radiation and quickly heat the wafer up to 800° to 1,000° C. Because quick heating with lamp light radiation makes it possible to uniformly heat a wafer, there is an advantage that the wafer is less warped compared to the case of putting a wafer in a previously heated furnace. When the ultimate temperature realized by quick heating is lower than 800° C., interstitial silicon atoms do not easily become undersaturated in the wafer or oxygen precipitate nuclei do not grow easily in the wafer. When the ultimate temperature exceeds 1,000° C. , the same problem as the existing method occurs. Therefore, it is preferable to set the ultimate temperature between 850° and 950° C. When the holding time is shorter than 0.5 min, the time for interstitial silicon atoms produced at the wafer surface to diffuse into the wafer is too short and oxygen precipitate nuclei do not adequately disappear In the vicinity of the wafer surface. Therefore, it is impossible to secure an adequate number of DZ layers. When the holding time exceeds 20 min, firstly, a DZ layer with an excessive thickness is obtained and secondly, oxygen precipitate nuclei are grown into stable sizes during the holding. In this case, because well-grown oxygen precipitates do not disappear even if interstitial silicon atoms diffuse later, the holding time can be set to 0.5 to 20 min. It is preferable to set the holding time between 1 and 7 min. Quick heating is performed in nitrogen gas, oxygen gas, or atmosphere. It Is preferable to perform quick heating in nitrogen gas.

In the present specification, quick heating means that heating is conducted at the temperature raising rate of 10° C./min or more. It is preferred that the temperature raising rate is high unless a warp or a crack is produced in a silicon wafer.

After the quick heating, it is preferable to naturally cool the silicon wafer down to room temperature, to heat the silicon wafer from 500° to 700° C. up to 800° to 1,100° C. at a rate of 2° to 10° C./min, and hold the wafer at the temperature for 2 to 48 hr in order to grow oxygen precipitate nuclei remaining in the wafer. The temperature raising rate and the heating temperature after natural cooling of the wafer is set to the above range so as to prevent the undersaturation of interstitial silicon atoms. Heating under and after natural cooling is performed in the same environment as the quick heating.

Generally, oxygen precipitate nuclei are stably grown when the concentration of interstitial silicon atoms is lower than their thermal equilibrium concentration (undersaturation), on the other hand, oxygen precipitate nuclei disappear or the growth of them tends to be suppressed when the concentration of interstitial silicon atoms is not lower than their thermal equilibrium concentration (supersaturation).

When quickly heating a silicon wafer containing oxygen precipitate nuclei in a characteristic process of the present invention from room temperature up to an ultimate temperature of 800° to 1,000° C. not only the wafer surface but also in the bulk a transient undersaturation of interstitial silicon atoms occurs, which induce a stable growth of oxygen precipitate nuclei. At the same time, in order to realize the thermal equilibrium state, interstitial silicon atoms are produced at the wafer surface and they start diffusing into the wafer. At the vicinity of the wafer surface, deficiency of interstitial silicon atoms is immediately supplied by the diffusion from the surface, and oxygen precipitate nuclei start disappearing. However because a certain time is required for the interstitial silicon atoms produced at the wafer surface to diffuse from the surface to the inside of the wafer, oxygen precipitate nuclei are stably grown larger as the depth from the wafer surface increases. Therefore, the density of oxygen precipitate nuclei decreases as the depth from the wafer surface decreases and the thickness of DZ layer where no oxygen precipitate nuclei is formed increases as the thermal treatment time (0.5 to 20 min) increases. Moreover, the diffusion coefficient of interstitial silicon atoms increases and the thickness of the DZ layer increases as the temperature rises in the range of 800° to 1,000° C.

By quickly heating the wafer and naturally cooling it up to room temperature and thereafter, heating it up to 800° to 1,100° C. again, oxygen precipitate nuclei remaining in the wafer after quick heating are grown to become oxygen precipitates and serve as an stable intrinsic-gettering source.

DESCRIPTION OF THE PREFERRED EMBODIMENT

An embodiment of the present invention is described below by referring to the accompanying drawings.

(a) Sample Preparation

Seven silicon wafers having the following characteristics are cut from a silicon single-crystal ingot pulled by the CZ method and are prepared as samples.

Diameter: 5 in

Plane orientation: <100>

Conducting type: P type (Boron is added as a dopant.)

Resistivity: Approx. 10 Ωm

Thickness: Approx. 620 μm

Initial interstitial-oxygen concentration: 1.3 to 1.4×10$^{18}$/cm$^3$ (old ASTM)

Initial carbon concentration: 1.0×10$^{16}$/cm$^3$ (old ASTM) or less (b) First-Step Heat Treatment (Introduction of Oxygen Precipitate Nuclei)

Figure 1:
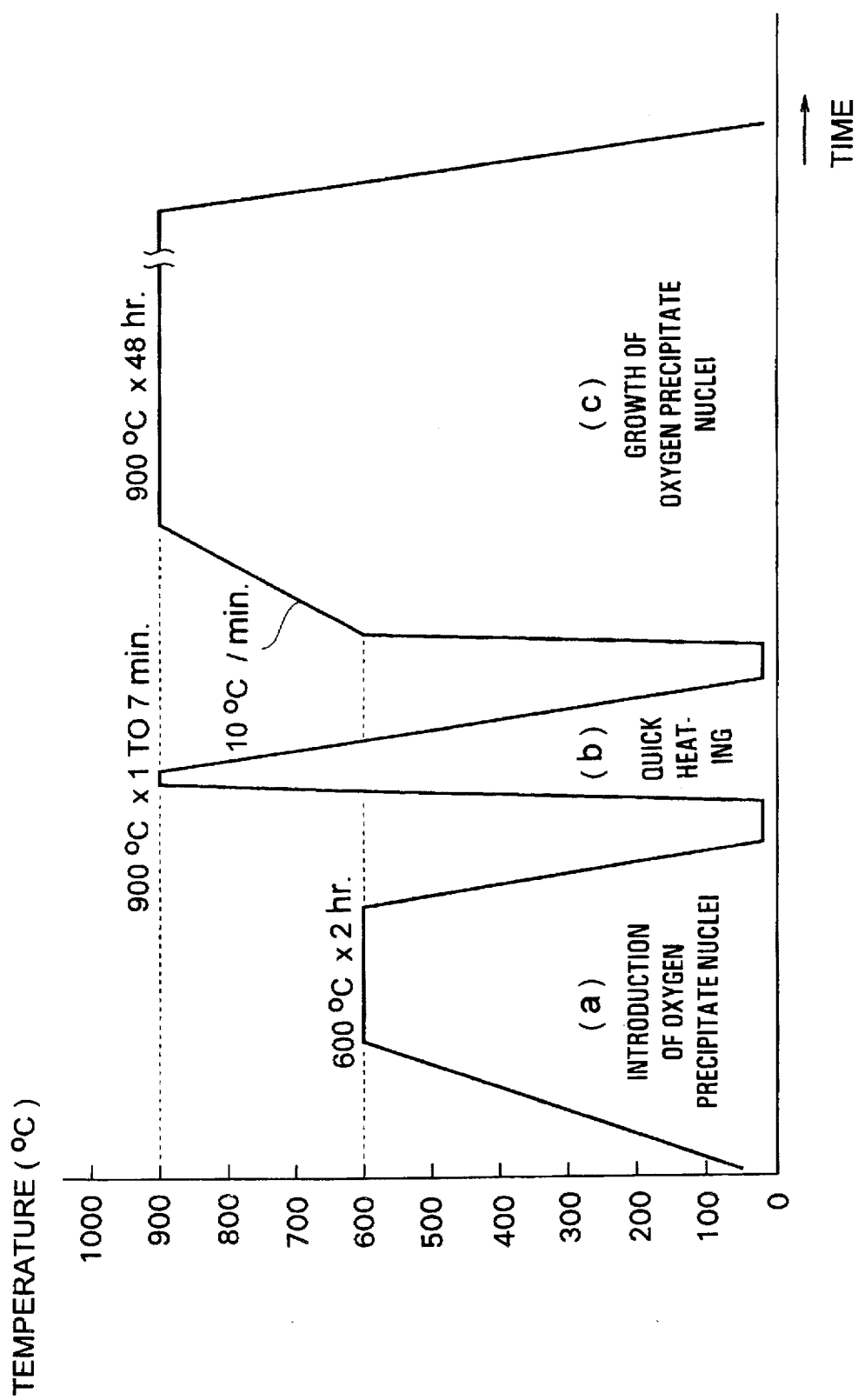
FIG. 1 is an illustration showing the relation between temperature and time of the intrinsic-gettering heat treatment of an embodiment of the present invention.

As shown in FIG. 1(a) seven samples are put in a heat treatment furnace pre-heated to 600° C. and held for $t_1$=2 hr in nitrogen gas. In this relatively low-temperature heat treatment, oxygen precipitate nuclei are introduced into a wafer.

Then, the seven samples are taken out of the furnace and naturally cooled down to the room temperature.

(c) Second-Step Heat Treatment (Quick Heating)

Then, as shown in FIG. 1(b), six samples are quickly put in a heat treatment furnace pre-heated to 900° C. and held for $t_2$=1, 2, 3, 4, 5, and 7 min respectively. The temperature raising rate is about 1,000° C./min. The samples heat-treated for the above six different holding times are quickly taken out of the furnace and naturally cooled up to room temperature. This quick heating makes only oxygen precipitate nuclei in an area nearby the wafer surface disappear and other oxygen precipitate nuclei remain in the wafer.

(d) Third-Step Heat Treatment (Growth of Oxygen Precipitate Nuclei)

Then, as shown in FIG. 1(c), seven samples are put in a furnace pre-heated at 600° C., and thereafter the temperature is increased, up to 900° C. at a rate of approx. 10° C./min. After the temperature reaches 900° C., the samples are kept for $t_3$=48 hr, then taken out of the furnace and naturally cooled down to the room temperature.

(e) Observation by an Optical Microscope

Figure 2:
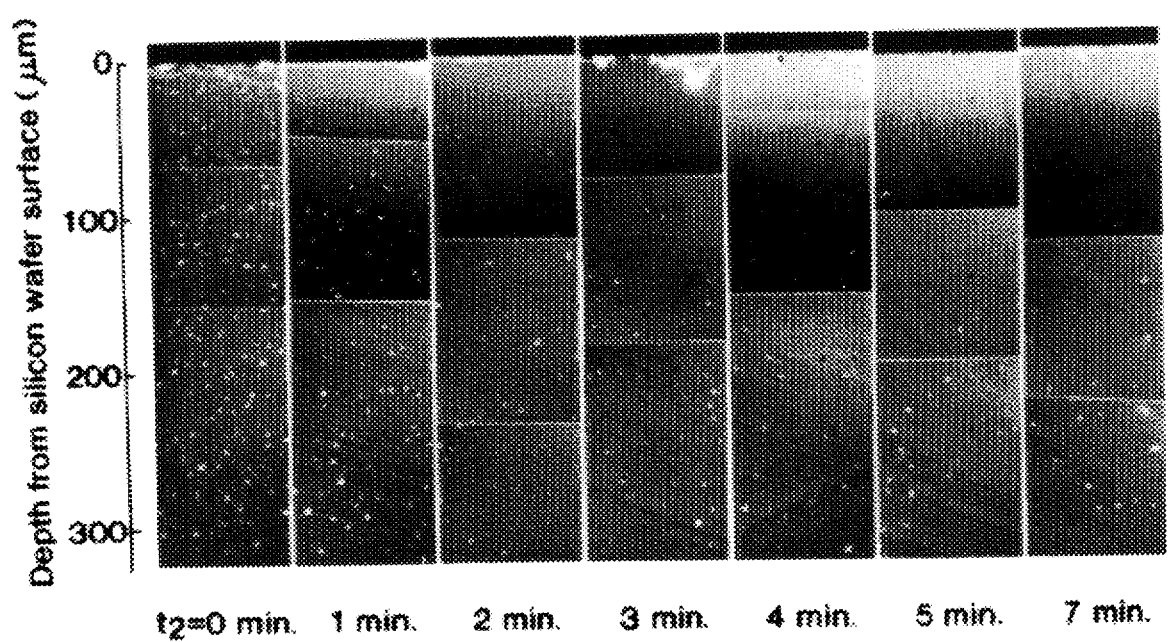
FIG. 2 is a microphotograph showing the distribution of oxygen precipitates in a cleaved surface of a silicon wafer of the embodiment of the present invention.

All the heat-treated samples are cleaved and their cleaved surfaces are treated with an etching solution (wright etching solution) with selectivity for oxygen precipitates and thereafter observed with an optical microscope. FIG. 2 shows the observation results. A number of small white spots shown in FIG. 2 represent oxygen precipitates. For the time of $t_2$=0 min. that is, in the case of the sample without second-step heat treatment, it is found from FIG. 2 that oxygen precipitates are uniformly introduced from the surface to the inside of the wafer. Moreover, it is found that the areas in which oxygen precipitates disappear, that is, the DZ layer increases as the time $t_2$ increases from 1 to 7 min. The DZ layer is approx. 20 μm for $t_2$=1 min and approx. 150 μm for $t_2$=7 min.

(f) Measurement of Oxygen Precipitate Density

Figure 3:
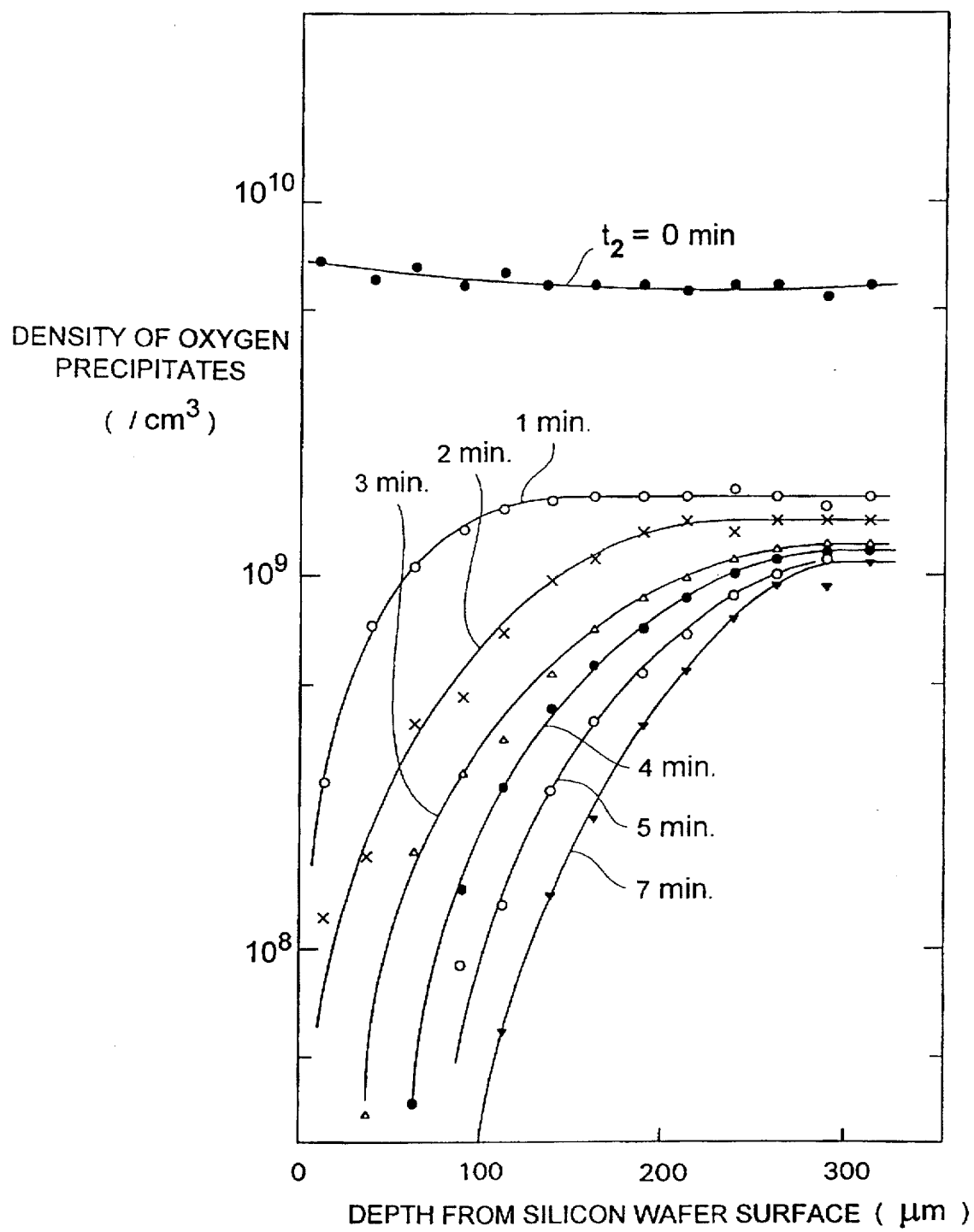
FIG. 3 is an illustration showing the distribution of oxygen precipitates at a cleaved surface of a silicon wafer of the embodiment of the present invention.
Figure 4:
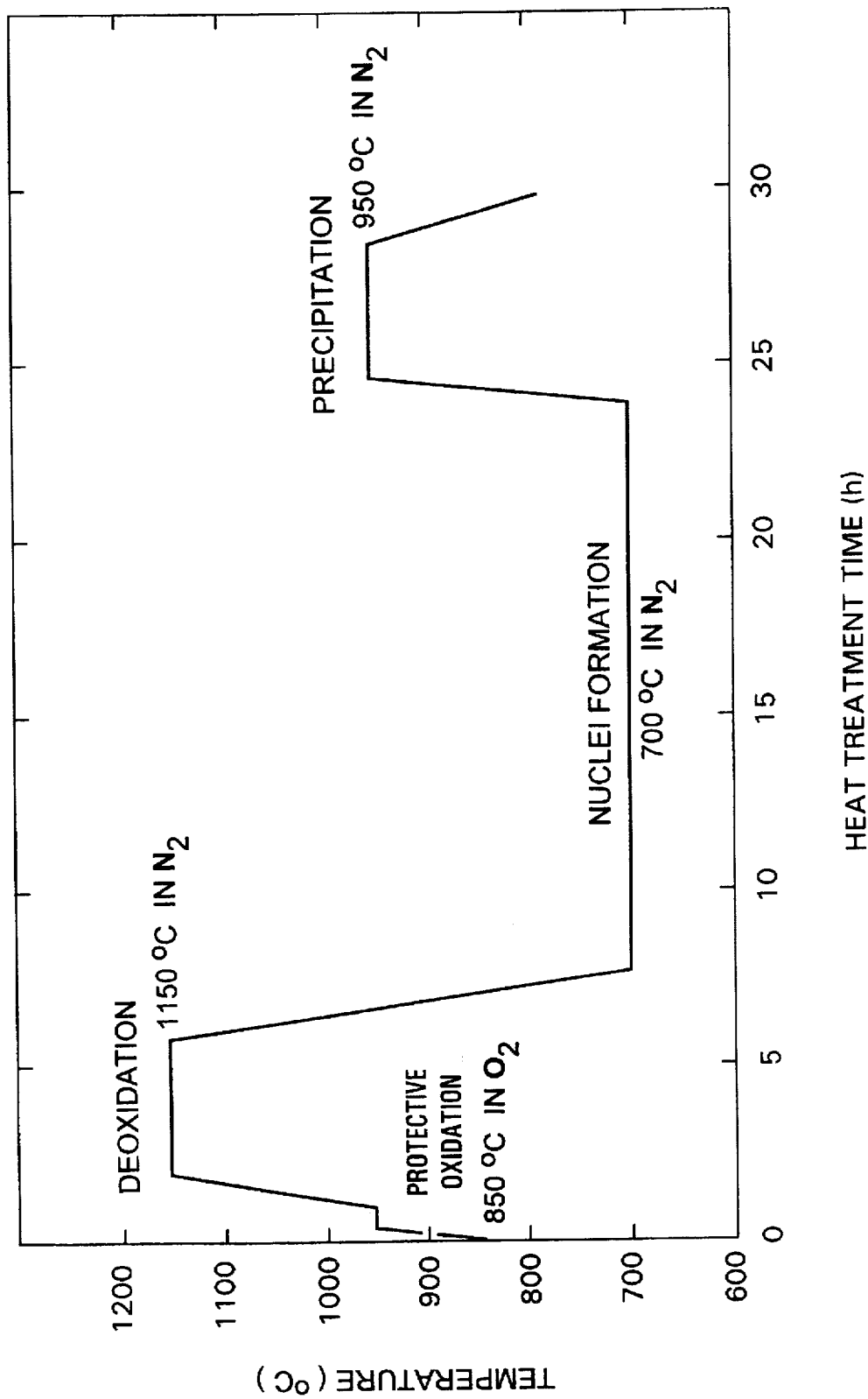
FIG. 4 is an illustration showing the relation between temperature and time of a conventional Intrinsic-gettering heat treatment corresponding to FIG. 1.

The density of oxygen precipitates resulting from grown oxygen precipitate nuclei is measured on seven samples. That is, the number of oxygen precipitates for the unit volume is measured for each sample as a function of the depth from the wafer surface. FIG. 3 shows the examination results. From FIG. 3, it is also found that oxygen precipitate nuclei gradually disappear from the wafer surface and the DZ layer increases as the time $t_2$ increases from 1 to 7 min similarly to the microphotograph in FIG. 2.

The existing formation of an intrinsic-gettering source requires a high-temperature treatment exceeding 1,000° C. which has problem, such as a silicon wafer is warped or easily contaminated, or a displacement called a slip line occurs. According to the present invention, however, it is possible to obtain a desired intrinsic-gettering effect and completely lower the recent device forming temperature by applying a heat treatment of 1,000° C. or lower to a silicon wafer.

Moreover, it is possible to form a DZ layer through a heat treatment for a relatively short time of several minutes, there is an advantage that the product manufacturing efficiency can be improved.

Furthermore, it Is possible to optionally change the thickness of a DZ layer by changing the holding temperature and the holding time in quick heating.

What is claimed is:

1. A method for the intrinsic-gettering for a silicon wafer by heating the wafer, comprising the steps of:

heating a silicon water containing oxygen precipitate nuclei from room temperature up to 800° to 1,000° C. at a rate of at least 10° C./min and holding the wafer at this temperature for 0.5 to 20 minutes to obtain a silicon wafer with effective intrinsic-gettering.

2. The method according to claim 1, wherein the heating is performed by rapidly setting a silicon wafer containing oxygen precipitate nuclei in a furnace pre-heated up to 800° to 1.000° C.

3. The method according to claim 1, further comprising the step of naturally cooling the heated silicon wafer and heating the naturally cooled silicon wafer up to 800° to 1,100° C. at a rate of 2° to 10° C./min from 500° to 700° C. and holding the wafer at the same temperature for 2 to 48 hr.

4. The method according to claim 2, further comprising the step of naturally cooling the heated silicon wafer and heating the naturally cooled silicon wafer up to 800° to 1,100° C. at a rate of 2° to 10° C./min from 500° to 700° C. and holding the wafer at the same temperature for 2 to 48 hr.

5. A method for the intrinsic-gettering for a silicon wafer by heating the wafer, comprising the steps of:

cutting a silicon crystal ingot, to form a wafer, and then grinding and polishing the wafer;

holding the polished wafer immediately thereafter at 500° to 800° C. for 0.5 to 20 hours to introduce oxygen precipitate nuclei into the wafer; and heating the silicon wafer containing the oxygen precipitate nuclei from room temperature up to 800° to 1,000° C. at a rate of at least 10° C./min and holding the wafer at this temperature for 0.5 to 20 min.

6. The method according to claim 1, wherein the heating is performed by lamp heating.

7. The method according to claim 5 further comprising the step of naturally cooling the heated silicon wafer and heating the naturally cooled silicon wafer up to 800° to 1,100° C. at a rate of 2° to 10° C./min from 500° to 700° C. and holding the wafer at the same temperature for 2 to 48 hr.

* * * * *

UNITED STATES PATENT AND TRADEMARK OFFICE
CERTIFICATE OF CORRECTION

PATENT NO. : 5,674,756
DATED : October 7, 1997
INVENTOR(S) : Yuhki SATOH, et al

It is certified that error appears in the above-identified patent and that said Letters Patent is hereby corrected as shown below:

TITLE PAGE

[73] Mitsubishi Materials Corporation,
Mitsubishi Materials Silicon Corporation, both of Tokyo Japan.

Signed and Sealed this

Tenth Day of February, 1998

Attest:

BRUCE LEHMAN

*Attesting Officer*  *Commissioner of Patents and Trademarks*